United States Patent
Daikokuya et al.

(10) Patent No.: US 9,164,838 B2
(45) Date of Patent: Oct. 20, 2015

(54) DISK ARRAY DEVICE AND DISK ARRAY DEVICE CONTROL METHOD

(75) Inventors: Hidejirou Daikokuya, Kawasaki (JP);
Kazuhiko Ikeuchi, Kawasaki (JP);
Chikashi Maeda, Kawasaki (JP);
Takeshi Watanabe, Kawasaki (JP);
Norihide Kubota, Kawasaki (JP);
Atsushi Igashira, Yokohama (JP); Kenji Kobayashi, Kawasaki (JP); Ryota Tsukahara, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 216 days.

(21) Appl. No.: 13/557,282

(22) Filed: Jul. 25, 2012

(65) Prior Publication Data
US 2013/0067165 A1 Mar. 14, 2013

(30) Foreign Application Priority Data

Sep. 9, 2011 (JP) .................. 2011-197543

(51) Int. Cl.
*G06F 11/10* (2006.01)
*G11C 29/44* (2006.01)
*G06F 11/22* (2006.01)
*G06F 3/06* (2006.01)

(52) U.S. Cl.
CPC ........ *G06F 11/1076* (2013.01); *G06F 11/2221* (2013.01); *G11C 29/4401* (2013.01); *G06F 3/0689* (2013.01); *G06F 2211/1073* (2013.01)

(58) Field of Classification Search
CPC . G06F 3/0689; G06F 11/106; G06F 11/2221; G11C 29/4401; G11C 29/48
See application file for complete search history.

(56) References Cited

U.S. PATENT DOCUMENTS

| 6,604,168 | B2* | 8/2003 | Ogawa ......................... 711/103 |
| 2007/0050670 | A1 | 3/2007 | Shigemura et al. |
| 2007/0250757 | A1* | 10/2007 | Takahashi ..................... 714/763 |
| 2009/0157959 | A1 | 6/2009 | Miyazaki |
| 2009/0164844 | A1* | 6/2009 | Tamura et al. .................. 714/25 |
| 2009/0190454 | A1 | 7/2009 | Onoue |
| 2010/0180167 | A1* | 7/2010 | Takasu .......................... 714/718 |
| 2010/0250845 | A1* | 9/2010 | Murase ......................... 711/114 |
| 2011/0055468 | A1* | 3/2011 | Gonzalez et al. ............. 711/103 |
| 2011/0107050 | A1* | 5/2011 | Vengerov ...................... 711/170 |

FOREIGN PATENT DOCUMENTS

| JP | 04-167046 | 6/1992 |
| JP | 2007-65788 A | 3/2007 |
| JP | 2009-151393 A | 7/2009 |
| JP | 2009-176101 | 8/2009 |
| JP | 2011-164868 A | 8/2011 |

OTHER PUBLICATIONS

Japanese Office Action mailed Mar. 3, 2015 for corresponding Japanese Patent Application No. 2011-197543, with Partial English Translation, 4 pages.

* cited by examiner

*Primary Examiner* — Idriss N Alrobaye
*Assistant Examiner* — Leandro Villanueva
(74) *Attorney, Agent, or Firm* — Fujitsu Patent Center

(57) ABSTRACT

A disk array device includes hard disks from which RAID groups are configured. Therein, a volume setting unit sets one or more used areas. A data check control unit determines, on the basis of the state into which the used areas have been set, which areas in the RAID groups are subject to a diagnosis. A data check execution unit that executes a cyclical diagnosis on the areas determined, by the data check control unit, to be those subject to a diagnosis.

5 Claims, 5 Drawing Sheets

DISK ARRAY DEVICE AND DISK ARRAY DEVICE CONTROL METHOD

CROSS-REFERENCE TO RELATED APPLICATION

This application is based upon and claims the benefit of priority of the prior Japanese Patent Application No. 2011-197543, filed on Sep. 9, 2011, the entire contents of which are incorporated herein by reference.

FIELD

The embodiment discussed herein is related to a disk array device and a disk array device control method.

BACKGROUND

In a disk array device, the state of a hard disk mounted thereon, particularly, the conditions of a head and a medium surface, is checked. Therefore, a disk array device is mounted with the function of checking the state of a hard disk.

As one type of this function of checking the state of a hard disk, there is a function that accesses a given amount of data each time on each disk device in a certain given cycle and performs check on a medium in a disk drive, data consistency check on a RAID (Redundant Arrays of Inexpensive Disks) group, and the like. One type of such cyclical disk checking is provided with a feature called write check (Write Check) and a feature called data check (Data Check). Write check is a feature configured to perform Write, Read, and Compare operations mainly for the purpose of checking a head. Whereas, data check is a feature configured to, mainly for the purpose of checking the medium surface of a disk, run verification on areas used by a user. Here, "verification" means to detect an area in which a fault has occurred and move undamaged data in that area to undamaged areas. For example, a technology called "Data Patrol" exists as a function having these two features that performs cyclical disk check.

Here, there are the following two views about areas on which to run the verification in data check. One view is that only areas having volumes set thereon have to be verified. The other view is that not only areas having volumes set thereon but also unused areas having no volumes set thereon have to be verified. In addition, which one of these two views is adopted for how areas on which to run the verification are determined is an important issue in using a disk array device. The state of use of the disk array device is an important key in thus determining areas on which to run the verification.

In the past, it was often the case that one disk array device was used exclusively by a specific user. For this reason, a prevailing manner of operation was formerly such that volumes were set before shipment and not subject to change after shipment. Therefore, it was formerly possible to presume that areas having volumes set thereon were areas that are appropriate for being subject to data check.

In contrast, a manner of operation such that a large-scale disk array device is used by two or more users at the same time with the internal resources of the device allocated among these users has been becoming increasingly common over recent years. In addition, a manner of operation such that each of the users freely creates and changes volumes has been becoming increasingly common. Therefore, the current situation is such that there is no general rule for determining whether areas appropriate for being subject to data check are only areas having volumes set thereon or areas including unused areas. This is because, although it was formerly possible to presume that unused areas were areas to remain unused in the future, it is recently possible to presume that unused areas are areas that are currently not in use but likely to be used in the future.

With regard thereto, in a case where data check is performed only on areas having volumes set thereon, when a volume is newly created for an unused area, work for creating the volume might be delayed because it is impossible to previously detect abnormality of a medium in this area. On the other hand, always performing data check on areas including unused areas results in performing data check on areas that are unlikely to be used in the near term, which is inefficient.

As a technology for determining areas subject to such data check, there is a related technology that measures the usage rate of a disk or the like, and, when the usage rate of a certain level is reached, performs check on unused areas, and newly uses areas on which check has been already performed (for example, Japanese Laid-open Patent Publication No. 2009-176101). Additionally, there is a related technology that obtains, on the basis of the operating condition of a processor, the state in which a storage device is used, and determines a test capacity of unused areas (for example, Japanese Laid-open Patent Publication No. 04-167046).

However, in the related technology that determines a test capacity of unused areas on the basis of the operating condition of a processor, a processing load for determining unused areas is large and affects the IO (Input Output) performance in the originally intended processing of a disk array device. On the other hand, the related technology that performs check on unused areas on the basis of the usage rate of a disk or the like is not capable of identifying the state in which these unused areas have been immediately before being used, and therefore, is not capable of handling aged deterioration and the like.

SUMMARY

According to an aspect of the embodiments, a disk array device includes a plurality of hard disks among which RAID groups are set up; a used-area setting unit that sets up one or a plurality of used areas in the RAID groups; a diagnosis subject determination unit that determines which areas in the RAID groups are subject to a diagnosis, based on the state into which the used areas have been set; and a diagnosis execution unit that executes a cyclical diagnosis on the areas determined, by the diagnosis subject determination unit, to be those subject to a diagnosis.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Preferred embodiments will be explained with reference to accompanying drawings. Note that the following embodiment does not limit the disk array device and the disk array device control method disclosed in the present application.

Figure 1:
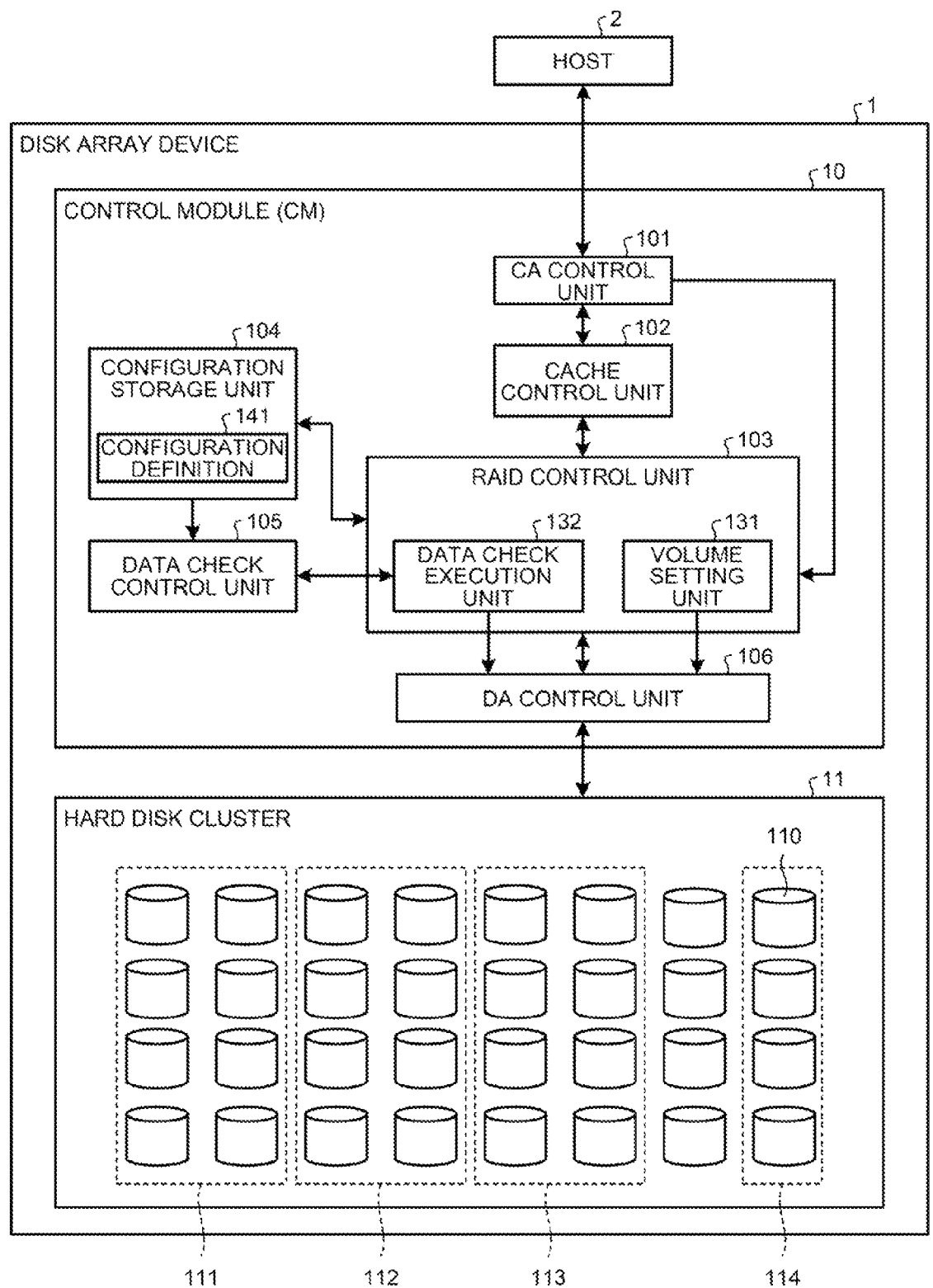
FIG. 1 is a block diagram of a disk array device according to an embodiment.

FIG. 1 is a block diagram of a disk array device according to an embodiment. As illustrated in FIG. 1, a disk array device 1 is connected to a host 2.

The host 2 is an information processing apparatus such as a personal computer or a server. The host 2 outputs commands such as data read and write to the disk array device 1. Then, the host 2 acquires requested data, as a reply to a read command, from the disk array device 1.

The disk array device 1 includes a control module (also referred to as "CM (Control Module)") 10 and a hard disk cluster 11.

The hard disk cluster 11 includes two or more hard disks. The hard disks included in the hard disk cluster 11 are, for example, a hard disk 110 and the like. Additionally, the hard disk cluster 11 includes a logical group constituted by use of two or more hard disks. In this embodiment, the hard disk cluster 11 includes three logical groups named RAID groups 111 to 113. Besides, a group 114 is a set of hard disks serving as hot spares for each of the RAID groups.

The control module 10 includes a CA (Channel Adapter) control unit 101, a cache control unit 102, a RAID control unit 103, a configuration storage unit 104, a data check control unit 105, and a DA (Device Adapter) control unit 106.

The CA control unit 101 controls a channel adapter (CA) which is an interface with the host 2. Specifically, the CA control unit 101 receives, via the channel adapter, data and commands that are transmitted from the host 2. For example, the CA control unit 101 receives, from the host 2, a write command together with data to be written. Additionally, the CA control unit 101 receives a data read command from the host 2. Besides, the CA control unit 101 receives a RAID construction command and the like from the host 2. Then, the CA control unit 101 outputs received data to the cache control unit 102. Additionally, the CA control unit 101 outputs a received command to the RAID control unit 103.

The CA control unit 101 informs the cache control unit 102 of a data read command. Then, the CA control unit 101 acquires designated data from the cache control unit 102. Then, the CA control unit 101 outputs acquired data to the host 2.

In the case of data write, the cache control unit 102 receives a data input from the CA control unit 101. Then, the cache control unit 102 stores, in the cache, data received from the CA control unit 101. Additionally, the cache control unit 102 receives a data read command from the RAID control unit 103. Then, the cache control unit 102 outputs designated data to the RAID control unit 103.

In the case of data read, the cache control unit 102 receives a data input from the RAID control unit 103. Then, the cache control unit 102 stores, in the cache, data received from the RAID control unit 103. Additionally, the cache control unit 102 receives a data read command from the CA control unit 101. Then, the cache control unit 102 outputs designated data to the CA control unit 101.

The configuration storage unit 104 is a storage device such as a hard disk and a memory. The configuration storage unit 104 stores a configuration definition 141 therein. The configuration definition 141 includes information on configurations of the RAID groups, information on volume setting, and management information on data check. The configuration definition 141 will be explained later in detail.

The RAID control unit 103 includes a volume setting unit 131 and a data check execution unit 132.

The RAID control unit 103 receives, from the CA control unit 101, a command outputted from the host 2. For example, upon receiving a RAID construction command, the RAID control unit 103 constructs, in accordance with an instruction for the construction, a RAID at a designated level with respect to designated disks. Then, the RAID control unit 103 generates the configuration definition 141 by using information of the thus constructed RAID group and stores the thus generated configuration definition 141 in the configuration storage unit 104.

Additionally, when the RAID control unit 103 receives from the CA control unit 101 a command to set a volume, the volume setting unit 131 sets a designated volume size on a designated RAID group in accordance with an instruction for the setting. This volume corresponds to one example of a "used area". Then, the RAID control unit 103 registers, in the configuration definition 141 of the RAID group, information on the volume set by the volume setting unit 131. This volume setting unit 131 corresponds to one example of a "used-area setting unit".

Figure 2:
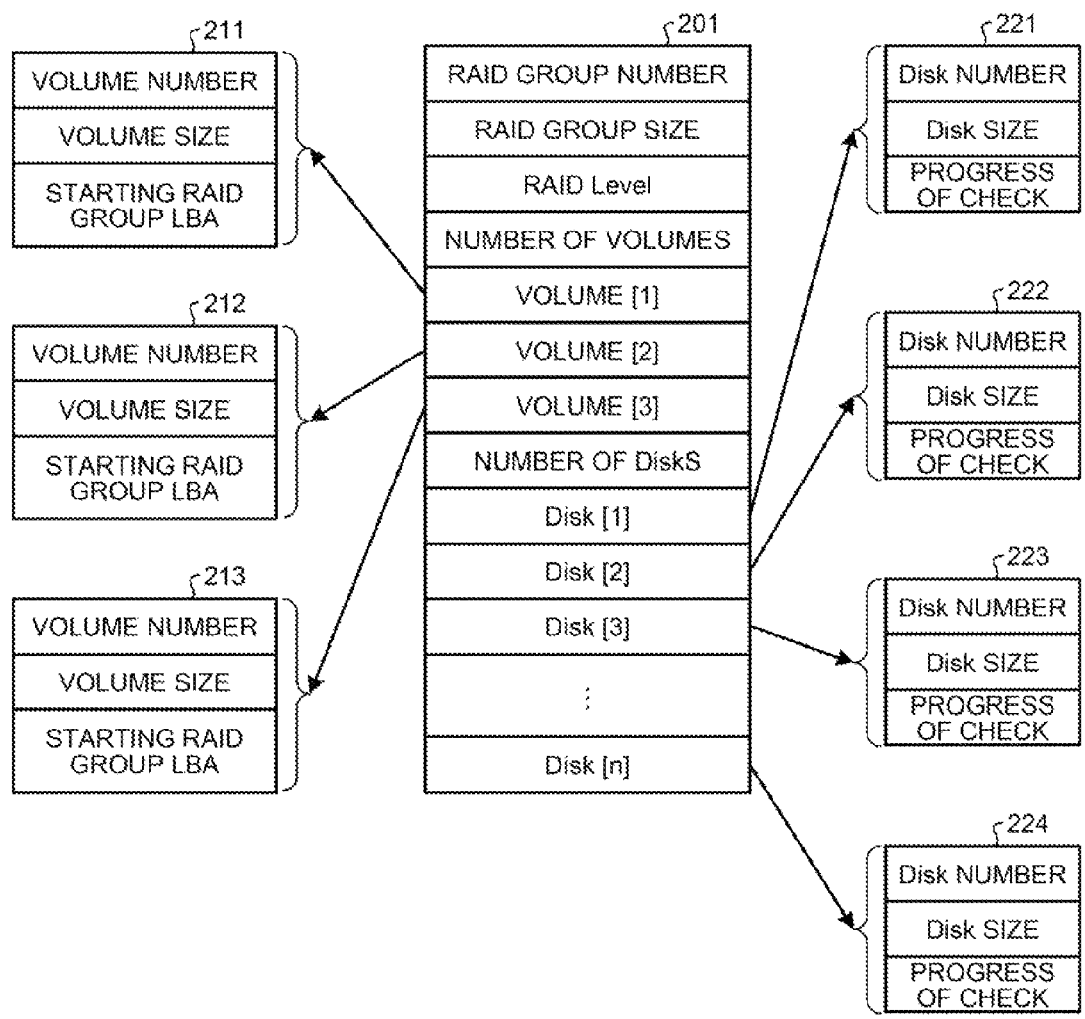
FIG. 2 is a diagram illustrating the outline of a configuration definition.

Here, a configuration definition will be explained. FIG. 2 is a diagram illustrating the outline of a configuration definition. A configuration definition is generated with respect to each RAID group. A configuration definition 201 illustrated in FIG. 2 represents a configuration definition for a single RAID group. Here, the explanation is given using, as an example, a case where the RAID group is composed of n hard disks. Hereinafter, a RAID group that is described in the configuration definition 201 will be referred to as a described RAID group. A RAID group number, a RAID group size, and a RAID level are stored in the configuration definition 201. The RAID group number is an identifier used for uniquely identifying the described RAID group. The RAID group size indicates the total capacity of the described RAID group. The RAID level is a kind of RAID used for constructing the described RAID group.

Additionally, the configuration definition 201 includes the number of volumes and information on the respective volumes. Here, the number of volumes indicates the number of volumes set on the described RAID group. Additionally, the information on the respective volumes corresponds to volumes [1] to [3] in FIG. 2. Here, the explanation is given using, as an example, a case where three volumes have been generated for the described RAID group. Information indicated by the tips of arrows leading from the information on the respective volumes in FIG. 2 has been described as detailed contents described as the information on volumes. Volume information 211 is information on a volume represented as the volume [1]. Volume information 212 is information on a volume represented as the volume [2]. Volume information 213 is information on a volume represented as the volume [3]. As is indicated by each set of the volume information 211 to 213, the volume information includes a volume number, a volume size, and a starting RAID group LBA (Logical Block Addressing). The volume number is an identifier used for identifying each volume in the described RAID group. For example, #0000 is described as the volume number in the volume information 211, #0001 is described as the volume number in the volume information 212, and #0002 is described as the volume number in the volume information 213. The volume size is the capacity of each volume. Additionally, the starting RAID group LBA is an address indicating a starting position of each volume.

Further, the configuration definition 201 includes the number of Disks and information on the respective Disks. The number of Disks is the number of hard disks constituting the described RAID group. Additionally, the information on the respective Disks corresponds to Disks [1] to [n] in FIG. 2. Information indicated by the tips of arrows leading from the information on the respective Disks in FIG. 2 has been described as detailed contents described as the information on Disks. Disk information 221 is information on a hard disk represented as the Disk [1]. Additionally, Disk information 222 is information on a hard disk represented as the Disk [2]. Additionally, Disk information 223 is information on a hard disk represented as the Disk [3]. Further, Disk information 224 is information on a hard disk represented as a Disk [n]. As is indicated by each set of the Disk information 221 to 224, the Disk information includes a Disk number, a Disk size, and a progress of check. The Disk number is an identifier used for uniquely identifying each of the hard disks constituting the described RAID group. For example, #0000 is described as the Disk number in the Disk 221, #0001 is described as the Disk number in the Disk 222. Additionally, #0002 is described as the volume number in the Disk 223, and #000n is described as the volume number in the Disk 224.

Referring back to FIG. 1, upon receiving a data write command, the RAID control unit 103 acquires, from the cache control unit 102, data designated to be written. Then, the RAID control unit 103 instructs the DA control unit 106 to write the thus acquired data into a designated volume of a designated RAID group. Additionally, upon receiving a data read command, the RAID control unit 103 instructs the DA control unit 106 to read designated data from a designated volume of a designated RAID group. Then, from the DA control unit 106, the RAID control unit 103 acquires the data that the RAID control unit 103 has instructed to read. Thereafter, the RAID control unit 103 outputs the acquired data to the cache control unit 102.

Additionally, the data check execution unit 132 executes data check in which the presence or absence of any error on the media surface of a hard disk is checked and verified, cyclically, for example, by the use of periods where processing such as read or write is not performed. This kind of data check is sometimes called "data patrol". In further details, the data check execution unit 132 repeats a process in which, once having performed data check, the data check execution unit 132 stops executing data check processing for a certain time period, and thereafter starts data check from a position at which data check has ended immediately before. In this connection, operation of the data check will be explained in detail.

Before executing data check, the data check execution unit 132 makes an inquiry to the data check control unit 105 about management information on data check. The management information on data check includes a RAID group subject to data check, a starting position of data check, an amount by which to perform data check at one time, and information on subject areas on which to perform data check. The information on subject areas on which to perform data check is information indicating which of the following is applied: a manner in which areas having volumes set thereon are to be designated as the subject areas; and a manner in which areas including unused areas in addition to those having volumes set thereon are designated as the subject areas. Additionally, the amount by which to perform data check at one time is specified as, for example, 1 MB, 2 MB or the like. Then, the data check execution unit 132 receives an input of the management information on data check, as a reply to the inquiry, from the data check control unit 105.

The data check execution unit 132 starts data check from a designated position in a RAID group designated by the management information on data check.

The following processing is performed as the specific contents of data check. The data check execution unit 132 sequentially reads data from the areas subject to data check. Then, at the occurrence of a read error, the data check execution unit 132 secures a backup area that substitutes for a data area in which the read error has occurred. Then, by using hard disks constituting the RAID group, the data check execution unit 132 reconstructs data in a location in which the read error has occurred. Then, the data check execution unit 132 records the reconstructed data in the secured area. Thereafter, upon completion of data check on the designated amount, the data check execution unit 132 informs the data check control unit 105 of the address of a position at which the data check has ended.

Additionally, upon completion of all the data check on the designated subject areas, the data check execution unit 132 makes an inquiry to the data check control unit 105 about management information on data check to be performed next. Then, in a case where unused areas also have been designated as the subject areas, the data check execution unit 132 performs data check on unused areas after firstly performing data check on areas having volumes set thereon. On the other hand, in a case where only areas having volumes set thereon data check have been designated as the subject areas, the data check execution unit 132 moves on to data check on a next RAID group upon completion of data check on areas in a certain RAID group that have volumes set thereon. Upon completion of data check on designated areas in all of the RAID groups, the data check execution unit 132 is instructed, by the data check control unit 105, to return to data check on a RAID group on which data check has been performed at the beginning. This data check execution unit 132 corresponds to one example of a "diagnosis execution unit".

The data check control unit 105 cyclically acquires the total capacity of each of the RAID groups and the size of each volume set in each of the RAID groups from the configuration definition 141. Further, the data check control unit 105 obtains the size of unused areas in each of the RAID groups by subtracting the total size of the volumes set in the RAID group from the total capacity of the RAID group. Then, the data check control unit 105 determines areas subject to data check in the respective RAID groups by using the total capacities of the respective RAID groups, the sizes of the volumes set in the respective RAID groups, and the unused areas. Thereafter, the data check control unit 105 registers, in the configuration definition 141, the areas thus determined to those subject to data check in the respective RAID groups. Here, a cycle in which the data check control unit 105 determines and registers areas subject to data check may be determined irrespective of a cycle in which the data check execution unit 132 actually performs data check. For example, it is preferable that, in accordance with operational situations of the disk array device, the cycle of determining and registering areas subject to data check be determined in a manner that allows adequate reflection of any change in the configurations of volumes.

The data check control unit 105 receives an inquiry from the data check execution unit 132 about management information on data check. The data check control unit 105 acquires RAID groups on which to perform data check, a starting position of data check, an amount by which to perform data check at one time, information on areas which to perform data check, and the like from the configuration definition 141. Then, the data check control unit 105 outputs the thus acquired information, as the management information on data check, to the data check execution unit 132.

After the completion of data check on subject areas in the designated RAID groups, the data check control unit 105 receives an inquiry from the data check execution unit 132 about management information on data check to be performed next. The data check control unit 105 acquires, from the configuration definition 141, management information on data check for a RAID group on which to perform data check next. Then, the data check control unit 105 outputs the thus acquired management information on data check for the RAID group on which to perform data check next, as management information on data check, to the data check execution unit 132. Here, the data check control unit 105 is designed to perform data check on the RAID groups, for example, in ascending order according to the RAID group numbers thereof. Further, the data check control unit 105 is designed to, after the completion of data check on all of the RAID groups, return to the RAID group having the smallest RAID group number and perform data check thereon again in ascending order according to the RAID group numbers.

Additionally, after each completion of data check, the data check control unit 105 receives from the data check execution unit 132 an input of an address at which data check has ended. Then, the data check control unit 105 writes the thus received address into the progress field in the configuration definition 141. For example, when data check has ended at a specific position on a hard disk represented as the Disk information 221 in a RAID group represented as the configuration definition 201 in FIG. 2, the data check control unit 105 receives an address, on the hard disk, at which the data check has ended. Then, the data check control unit 105 registers the received address in the progress field of the Disk information 221 of the configuration definition 201. This enables the data check control unit 105 to acquire the starting position of next data check by searching the progress field for each hard disk. This data check control unit 105 corresponds to one example of a "diagnosis subject determination unit".

Here, in this embodiment, for the purpose of consolidated management of management information on data check, the data check execution unit 132 is designed to acquire management information on data check from the data check control unit 105 each time data check is started or at the completion of data check on subject areas. However, this may be acquired in a different manner. For example, the data check execution unit 132 may be designed to acquire information directly from the configuration definition 141 at the time of performing data check.

Figure 3:
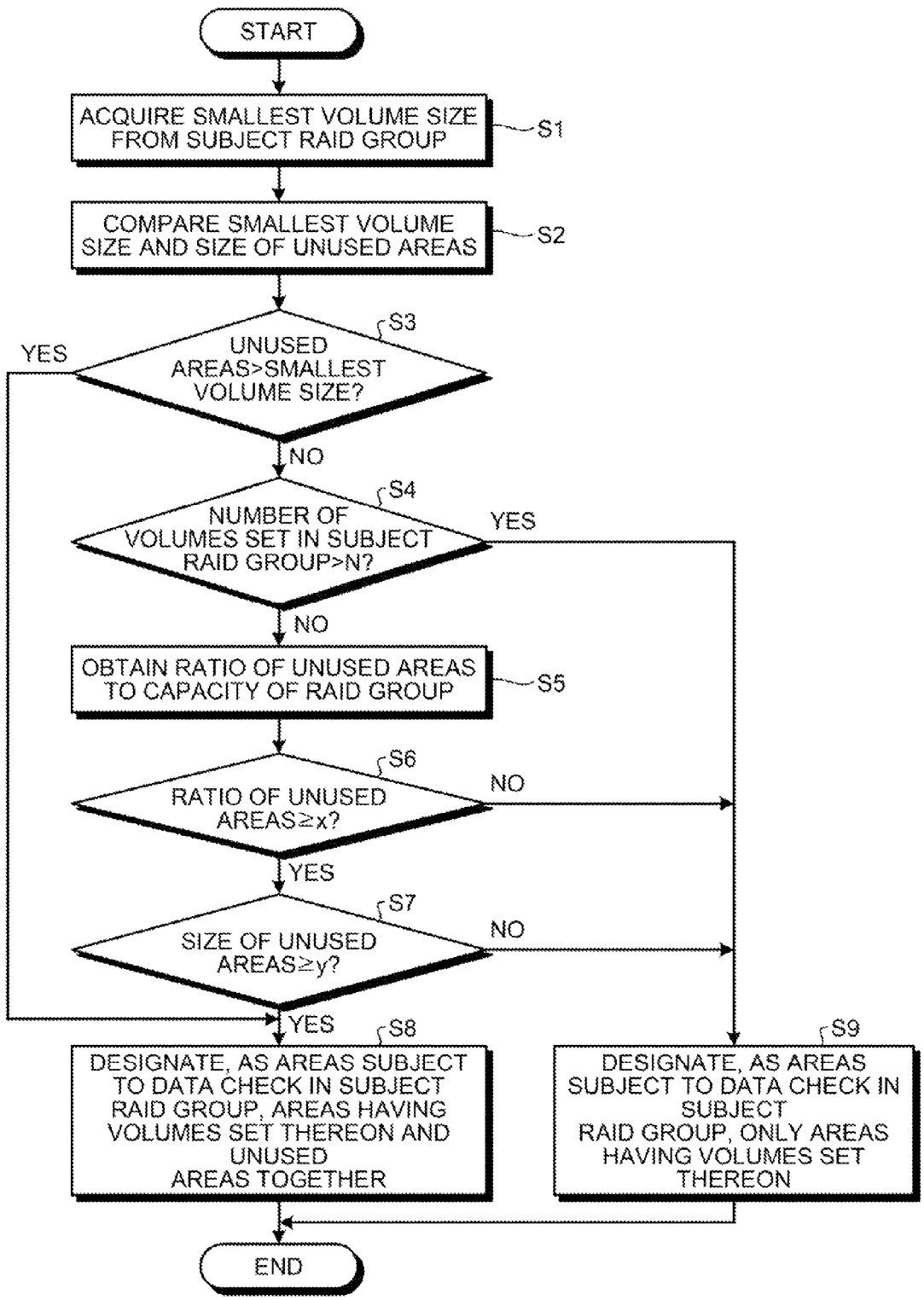
FIG. 3 is a flowchart of processing for determining areas subject to data check.

Here, the flow of determination of areas subject to data check, made by the data check control unit 105, will be explained with reference to FIG. 3. FIG. 3 is a flowchart of processing for determining areas subject to data check. Here, determination of areas subject to data check in one RAID group will be explained. Hereinafter, a RAID group in which to determine areas subject to data check is referred to as a "subject RAID group".

The data check control unit 105 acquires the smallest volume size from the volume sizes of volumes set on a subject RAID group acquired from the configuration definition 141 (Step S1).

The data check control unit 105 compares the acquired smallest volume size and the size of unused areas (Step S2). Then, the data check control unit 105 determines whether the size of the unused areas exceeds the smallest volume size (Step S3). When the size of the unused areas exceeds the smallest volume size (Yes in Step S3), the data check control unit 105 determines areas subject to data check in the subject RAID group to be areas having volumes already set thereon and unused areas together (Step S8). This is because: when the size of the unused areas exceeds the smallest volume size, the possibility of registering another volume in the unused areas is high; and therefore, data check on the unused areas is performed beforehand to make it possible to avoid the occurrence of a fault whenever a volume is set in the unused areas.

On the other hand, when the size of the unused areas does not exceed the smallest volume size (No in Step S3), the data check control unit 105 determines whether the number of volumes set in the subject RAID group exceeds a predetermined threshold N (Step S4). When the number of volumes set in the subject RAID group exceeds the predetermined threshold N (Yes in Step S4), the data check control unit 105 determines areas subject to data check in the subject RAID group to be only those areas that have volumes already set thereon (Step S9). This is because: when the number set in the subject RAID group is large, a large statistical figure is available, which enables a prediction about use of the unused areas to be made with a high degree of confidence through the determination using the volume sizes; in addition, when the size of the unused areas does not exceed the smallest volume size, the possibility of registering another volume in the unused areas is low; and therefore, for fast data check and load reduction, only the areas having volumes already set thereon are subject to data check while the unused areas are not subject to data check.

On the other hand, when the number of volumes set in the subject RAID group is below the predetermined threshold N (No in Step S4), prediction, about whether the unused areas are to be used, that is made only through the determination using the volume sizes has a lower degree of confidence. Therefore, another determination criterion is used in order to increase the accuracy. Therefore, the data check control unit 105 obtains the ratio of the unused areas to the total capacity of the subject RAID group (Step S5).

Next, the data check control unit 105 determines whether the thus obtained ratio of the unused areas is at least a predetermined threshold value x (Step S6). When the ratio of the unused areas is below the predetermined threshold value x (No in Step S6), the data check control unit 105 designates only the areas having volumes set thereon as areas subject to data check in the subject RAID group (Step S9). For example, the threshold value x may be set to 1.0. In that case, when the ratio of the unused areas is below 1.0, the data check control unit 105 designates only the areas having volumes set thereon as areas subject to data check in the subject RAID group. This is because, when the ratio of the unused areas is smaller relative to the entire RAID groups to a certain degree, the possibility of using the unused areas is considered to be low. Here, although this embodiment is explained using as an example the case where x=0.1, the threshold value x may be set to another value, and it is preferable that, in accordance with the operational state, the threshold value x be set to a value such that the possibility of using the unused areas is almost zero as long as the ratio of the unused areas relative to the whole is below this value.

On the other hand, the ratio of the unused areas is at least the predetermined threshold value x (Yes in Step S6), the data check control unit 105 determines whether the size of the unused areas is at least a predetermined threshold value y (Step S7). When the size of the unused areas is below the predetermined threshold value y (No in Step S7), the data check control unit 105 designates only the areas having volumes set thereon as areas subject to data check in the subject RAID group (Step S9). For example, the threshold value y may be set to 10 GB. In that case, when the size of the unused areas is below 10 GB, the data check control unit 105 designates only the areas having volumes set thereon as areas subject to data check in the subject RAID group. This is because, when the size of the unused areas is small to a certain degree, the possibility of using the unused areas is considered to be low. Here, although this embodiment is explained using as an example the case where y=10 GB, the threshold value y may be set to another value, and it is preferable that, in accordance with the operational state, the threshold value y be set to a value such that use of the unused areas is unlikely as long as the size of the unused areas is below this value.

The DA control unit 106 receives, from the RAID control unit 103, designation of a RAID group and a volume into which to write data, and an input of data to be written. The DA control unit 106 writes the received data into the designated volume in the designated RAID group.

The DA control unit 106 receives, from the RAID control unit 103, designation of a RAID group and a volume from which to read data. The DA control unit 106 reads data from the designated volume in the designated RAID group. The DA control unit 106 outputs the read data to the RAID control unit 103.

Figure 4:
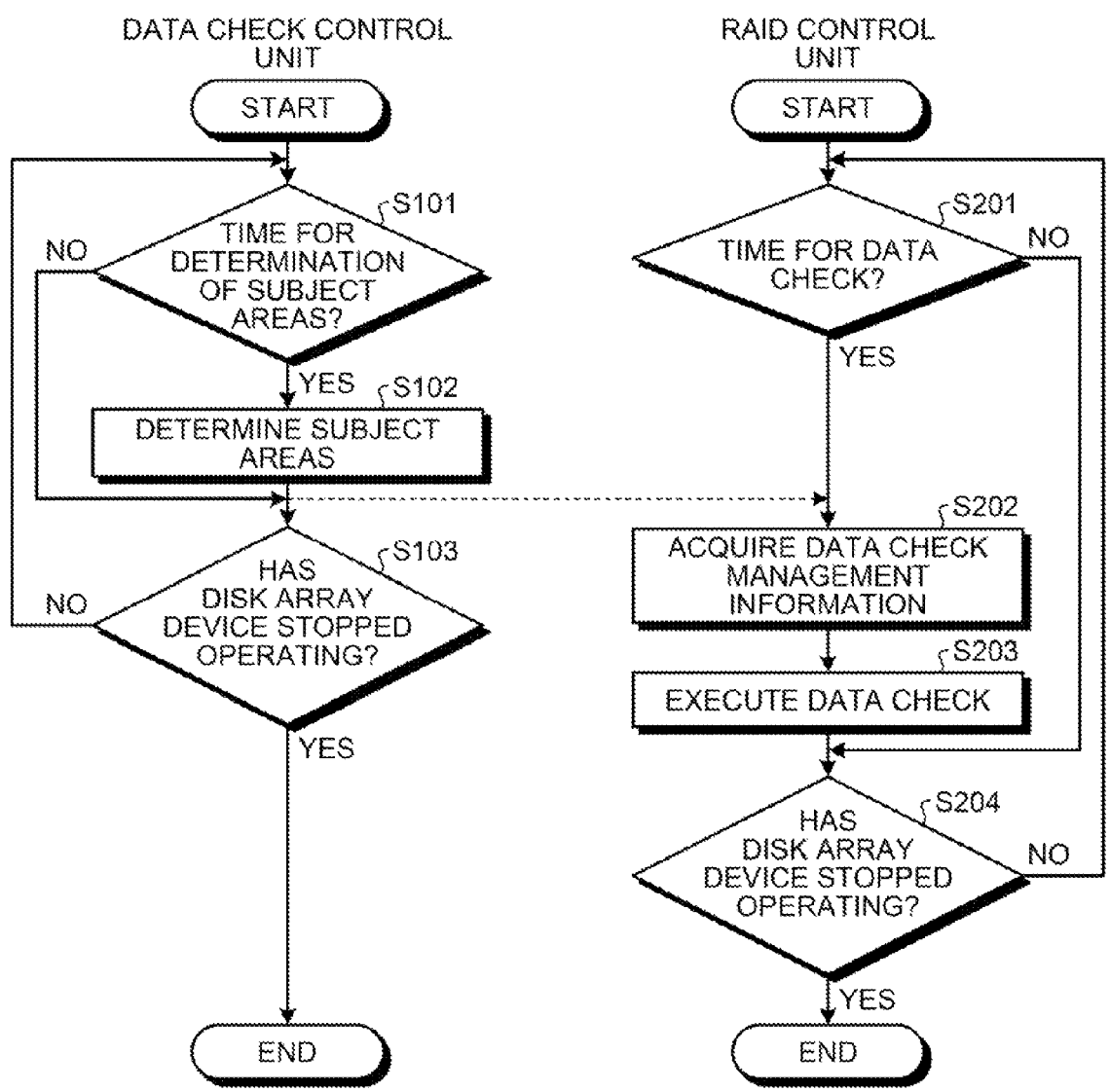
FIG. 4 is a flowchart of processing for determining areas subject to data check and for data check.

Next, the flow of processing for determination of areas subject to data check and for data check will be explained with reference to FIG. 4. FIG. 4 is a flowchart of the processing for determination of areas that are subject to data check and for data check. The flow in the left side on the page of FIG. 4 represents processing for determination by the data check control unit 105 of areas that are subject to data check, whereas the flow in the right side on the page thereof represents processing for data check by the data check execution unit 132. Additionally, the dotted arrow in FIG. 4 indicates transmission of management information on data check from the data check control unit 105 to the data check execution unit 132.

The data check control unit 105 determines whether the time for determination of areas subject to data check, which is repeated in a given cycle, has come (Step S101).

When the time therefor has come (Yes in Step S101), the data check control unit 105 determines areas subject to data check (Step S102). In Step S102, specifically, the data check control unit 105 performs the processing represented by the flowchart in FIG. 3. On the other hand, when the time therefor is yet to come (No in Step S101), the data check control unit 105 proceeds to Step S103.

The data check control unit 105 determines whether the disk array device has stopped operating (Step S103). When the disk array device has not stopped operating (No in Step S103), the data check control unit 105 returns to Step S101. On the other hand, when the disk array device has stopped operating (Yes in Step S103), the data check control unit 105 ends the processing for determination of areas subject to data check.

The data check execution unit 132 determines whether the time for data check, which is repeated in a given cycle, has come (Step S201).

When the time therefor has come (Yes in Step S201), the data check execution unit 132 acquires management information on data check from the data check control unit 105 (Step S202). Then, the data check execution unit 132 performs, in areas that the received management information on data check designates as those subject to data check, a designated amount of data check on volumes in a designated RAID group (Step S203). On the other hand, when the time therefor is yet to come (No in Step S201), the data check execution unit 132 proceeds to Step S204.

The data check execution unit 132 determines whether the disk array device has stopped operating (Step S204). When the disk array device has not stopped operating (No in Step S204), the data check execution unit 132 returns to Step S201. On the other hand, when the disk array device has stopped operating (Yes in Step S204), the data check execution unit 132 ends the processing for data check.

Hardware Configuration

Figure 5:
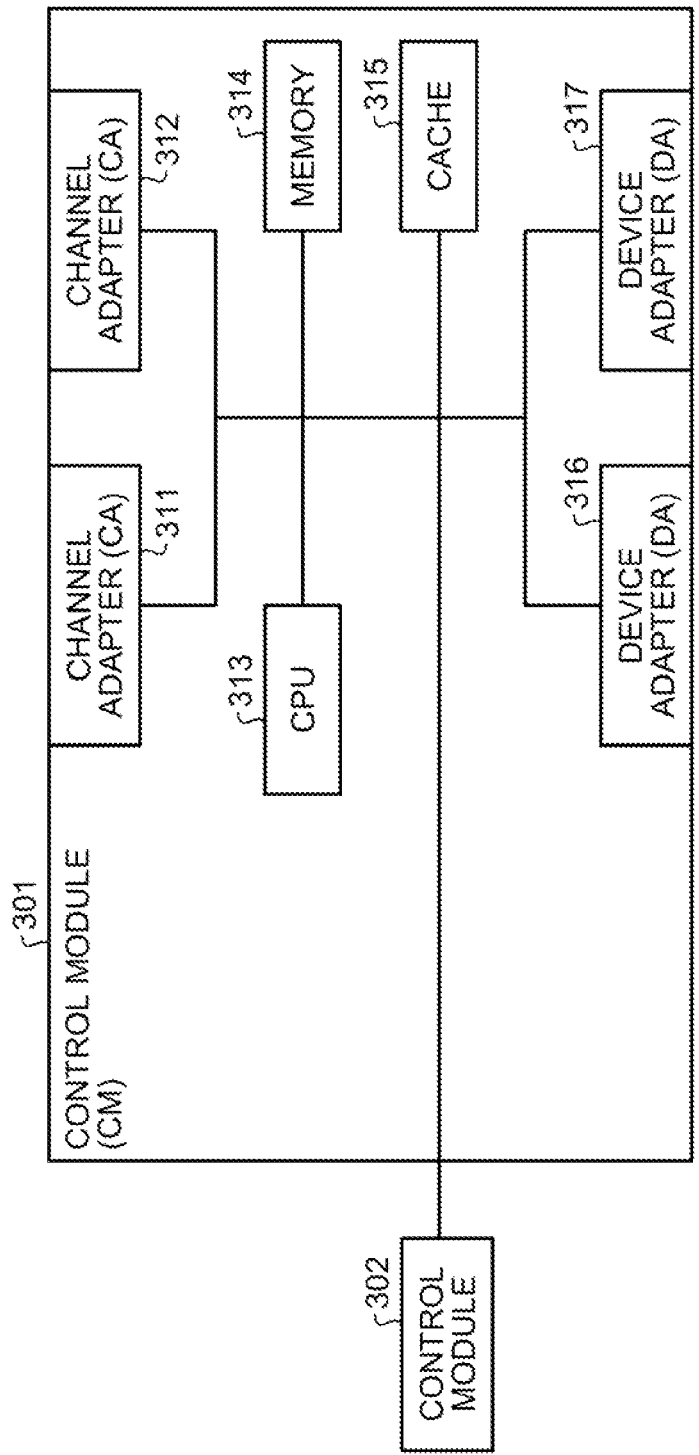
FIG. 5 is a configuration diagram of the hardware of control modules of the disk array device according to the embodiment.

Next, the hardware configurations of control modules of the disk array device according to this embodiment will be explained with reference to FIG. 5. FIG. 5 is a configuration diagram of the hardware of the control modules of the disk array device according to the embodiment. Here, the explanation is given using a case where, while the disk array device includes a control module 301 and a control module 302, the control module 301 and the control module 302 are connected to each other. Further, the control module 301 and the control module 302 have the identical configurations, and therefore, the explanation is given using the control module 301 as an example.

The control module (CM) 301 includes channel adapters (CAs) 311 and 312, a CPU (Central Processing Unit) 313, a memory 314, a cache 315, and device adapters (DAs) 316 and 317.

The channel adapters 311 and 312, the memory 314, the cache 315, and the device adapters 316 and 317 are connected to the CPU 313 via buses. Additionally, the bus of the control module 301 is connected to the bus of the control module 302, the control module 301.

The channel adapters 311 and 312 are connected to a host (not illustrated) such as one illustrated in FIG. 1. The channel adapters 311 and 312 and the CPU 313 in combination actualize, for example, the functions of the CA control unit 101 illustrated in FIG. 1.

Additionally, the device adapters 316 and 317 are connected to a hard disk cluster (not illustrated) such as one illustrated in FIG. 1. The cache 315 and the CPU 313 in combination actualize, for example, the functions of the cache control unit 102 illustrated in FIG. 1.

Additionally, the device adapters 316 and 317 and the CPU 313 in combination actualize, for example, the functions of the DA control unit 106 illustrated in FIG. 1.

Additionally, the memory 314 actualizes the functions of the configuration storage unit 104 illustrated in FIG. 1.

Further, the CPU 313 and the memory 314 in combination actualize, for example, the functions of the RAID control unit 103, the data check control unit 105 and the like which are illustrated in FIG. 1. For example, the memory 314 stores therein various programs that actualize processing to be performed by units including the RAID control unit 103, the volume setting unit 131, the data check execution unit 132, and the data check control unit 105 which are illustrated in FIG. 1. Whereas, the CPU 313 generates processes that actualize the above mentioned functions by reading these various programs from the memory 314 and deploying these programs. In addition, the CPU 313 executes the above mentioned functions on the basis of the generated processes.

As explained above, the disk array device according to this embodiment cyclically determines areas subject to data check, and cyclically performs data check on the thus determined subject areas. Further, the disk array device according to this embodiment uses the relationship between the size of unused areas and the size of the volumes, the ratio of unused areas, the size of unused areas, and the like to determine areas subject to data check. Using criteria such as those mentioned above makes it possible to determine, with a high degree of confidence, the possibility of using unused areas. Further, cyclically performing data check on areas determined to be areas subject to data check makes it possible to, whenever unused areas are used, shorten a time period from the last time when data check has been performed. For this reason, it is possible to suppress occurrence of a disk fault at the start of using unused areas.

Here, in this embodiment, so that the possibility of using unused areas may be determined with a higher degree of confidence, the determination is made through a combination of three forms of determination that are: determination using the relationship between the size of unused areas and the size of the volumes; determination using the ratio of unused areas; and determination using the size of unused areas. However, a manner for the determination may be determined in accordance with the accuracy desired in determining the possibility of using unused areas. For example, when reduction of the load of determination processing is desired without pursuit of very high accuracy, only any one of those forms of determination may be used. Alternatively, any two of those forms of determination may be used in combination in the pursuit of balancing between the accuracy of the determination and the load of determination processing.

According to an aspect of an embodiment, a disk array device and a disk array device control method that are disclosed by the present application have effect of suppressing occurrence of faults of a disk when unused areas are used.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A disk array device comprising:
   a plurality of hard disks among which a RAID group is set up, the RAID group having a plurality of volumes;
   a used-area setting unit that sets up one or a plurality of used areas in the RAID groups;
   a diagnosis subject determination unit that, when the size of the used area that is the smallest among the used areas set in the RAID groups is greater than or equal to the size of unused area in the RAID group, determines whether a number of volumes set in the RAID group is smaller than a predetermined threshold, that obtains the ratio of unused areas to all of the areas in the RAID group when the number of volumes set in the RAID group is smaller than the predetermined threshold, that determines whether the unused area in the RAID group have a size smaller than a predetermined size when the obtained ratio is greater than or equal to a predetermined value, and that designates all of the areas in the RAID group as areas which are subject to a diagnosis when the unused area in the RAID group have a size greater than or equal to the predetermined size; and
   a diagnosis execution unit that executes a cyclical diagnosis on the areas determined, by the diagnosis subject determination unit, to be areas which are subject to a diagnosis.

2. The disk array device according to claim 1, wherein, when the size of the used area that is the smallest among the used areas set in the RAID group is below the size of the unused area therein, the diagnosis subject determination unit designates, as areas which are subject to a diagnosis, all of the areas in the RAID group.

3. The disk array device according to claim 1, wherein the diagnosis subject determination unit when the obtained ratio is below the predetermined value, designates, as areas which are subject to a diagnosis, the areas on which the used areas have been set.

4. The disk array device according to claim 1, wherein, when unused areas in the RAID group have the size smaller than the predetermined size, the diagnosis subject determination unit designates, as areas which are subject to a diagnosis, the areas on which the used areas have been set.

5. A disk array device control method comprising:
   setting one or a plurality of used areas in a RAID group set up by use of a plurality of hard disks, the RAID group having a plurality of volumes;
   determining whether a number of volumes set in the RAID group exceeds a predetermined threshold, when the size of the used area that is smallest among the used areas set in the RAID group is greater than or equal to the size of the unused area in the RAID group;
   obtaining the ratio of unused areas to all of the areas in the RAID group, when the number of volumes set in the RAID group is smaller than the predetermined threshold;
   determining whether the unused area in the RAID group have a size smaller than a predetermined size, when the obtained ratio is at least a predetermined value;
   designating all of the areas in the RAID group as areas which are subject to a diagnosis, when the unused area in the RAID group have a size greater than or equal to the predetermined size; and
   executing a cyclical diagnosis on the areas thus determined to be areas which are subject to a diagnosis.

* * * * *